United States Patent
Kondo et al.

(10) Patent No.: US 10,839,745 B2
(45) Date of Patent: Nov. 17, 2020

(54) DISPLAY UNIT INCLUDING A PHOTOCHROMIC LAYER AND AN ULTRAVIOLET ABSORPTION LAYER

(71) Applicant: JOLED INC., Tokyo (JP)

(72) Inventors: Masahiko Kondo, Tokyo (JP); Jiro Yamada, Tokyo (JP); Atsuhito Murai, Tokyo (JP); Yasuhiro Terai, Tokyo (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/245,182

(22) Filed: Jan. 10, 2019

(65) Prior Publication Data

US 2019/0318688 A1   Oct. 17, 2019

(30) Foreign Application Priority Data

Apr. 17, 2018   (JP) .................. 2018-079224

(51) Int. Cl.
*G09G 3/3225* (2016.01)
*H01L 27/32* (2006.01)
*F21V 8/00* (2006.01)
*G02F 1/01* (2006.01)

(52) U.S. Cl.
CPC ......... *G09G 3/3225* (2013.01); *G02B 6/0066* (2013.01); *G02F 1/0126* (2013.01); *H01L 27/3232* (2013.01); *G02F 2201/086* (2013.01); *G09G 2320/066* (2013.01)

(58) Field of Classification Search
CPC .. G09G 3/3225; G09G 3/3208; G09G 3/3233; G09G 3/32; G09G 2320/0626; G09G 2320/066; G09G 2300/023; G02F 2201/086; G02F 1/133514; G02F 1/15; G02F 1/153; G02F 1/133617; G02F 1/133512; G02F 2202/14; G02F 2202/10; H01L 27/3232; H01L 27/326; H01L 51/5281
See application file for complete search history.

(56) References Cited

U.S. PATENT DOCUMENTS

| | | | |
|---|---|---|---|
| 2013/0194167 A1 | 8/2013 | Yun et al. | |
| 2013/0208201 A1* | 8/2013 | Satoh | G02F 1/1334 349/33 |
| 2016/0104752 A1* | 4/2016 | Oh | H01L 51/5284 257/40 |
| 2016/0146988 A1* | 5/2016 | Kim | G02B 5/201 349/61 |

FOREIGN PATENT DOCUMENTS

| | | |
|---|---|---|
| JP | 2013-156635 A | 8/2013 |
| JP | 2014-72126 A | 4/2014 |

* cited by examiner

*Primary Examiner* — Xuemei Zheng
(74) *Attorney, Agent, or Firm* — Hauptman Ham, LLP

(57) ABSTRACT

A display unit includes a display panel, a photochromic layer, and an ultraviolet absorption layer. The photochromic layer is configured to be colored by ultraviolet light and be decolored or color-faded by visible light. The display panel includes an image display surface with a plurality of pixels. The pixels are provided below the image display surface and each include an organic light-emitting layer.

4 Claims, 7 Drawing Sheets

DISPLAY UNIT INCLUDING A PHOTOCHROMIC LAYER AND AN ULTRAVIOLET ABSORPTION LAYER

CROSS REFERENCE TO RELATED APPLICATIONS

This application claims the benefit of Japanese Priority Patent Application JP 2018-079224 filed on Apr. 17, 2018, the entire contents of which are incorporated herein by reference.

BACKGROUND

The disclosure relates to a display unit.

Various proposals have been made on a display unit using an organic electroluminescent element. For example, reference is made to Japanese Unexamined Patent Application Publications No. 2014-072126 and No. 2013-156635.

SUMMARY

In the above-described display unit, in a case where a light-transmissive region through which light incident from behind a display is transmitted is provided in a display region, visibility is more likely to be deteriorated by reduction in contrast or any other factor. Further, in the above-described display unit, in a case where a screen displays black during non-display of an image, the screen displaying black is noticeable unnaturally in a surrounding environment. It is desirable to provide a display unit that makes it possible to reduce deterioration in visibility caused by reduction in contrast or any other factor and to make the screen less noticeable unnaturally in the surrounding environment.

A display unit according to an embodiment of the disclosure includes a display panel, a photochromic layer, and an ultraviolet absorption layer. The photochromic layer is configured to be colored by ultraviolet light and be decolored or color-faded by visible light. The display panel includes an image display surface with a plurality of pixels. The pixels are provided below the image display surface and each include an organic light-emitting layer.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Figure 1:
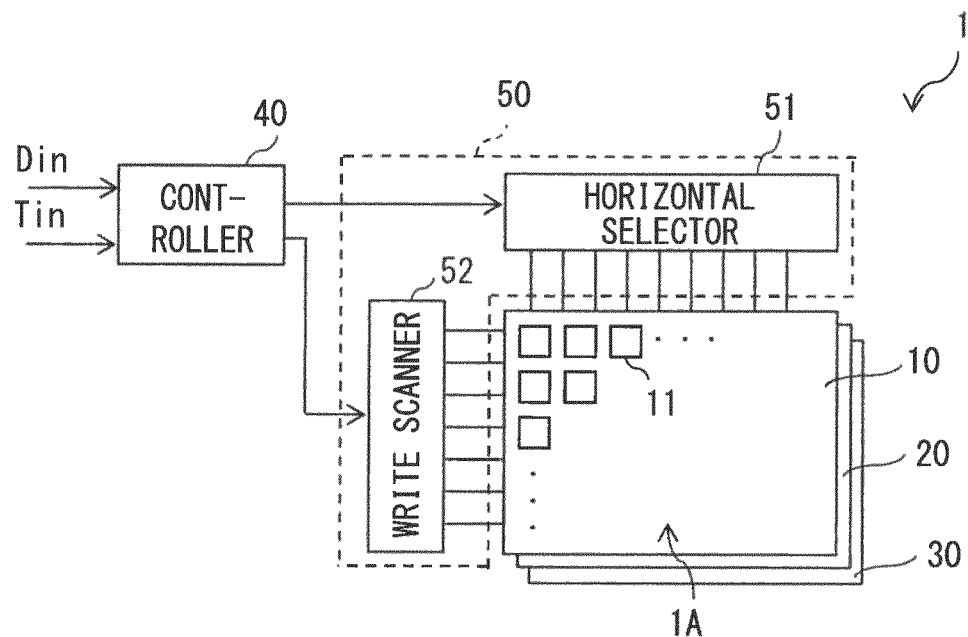
FIG. 1 schematically illustrates a configuration example of a display unit according to one example embodiment of the disclosure.

Some example embodiments of the disclosure are described below in detail with reference to the accompanying drawings. It is to be noted that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. It is to be noted that the like elements are denoted with the same reference numerals, and any redundant description thereof will not be described in detail.

1. Example Embodiment

[Configuration]

Figure 2:
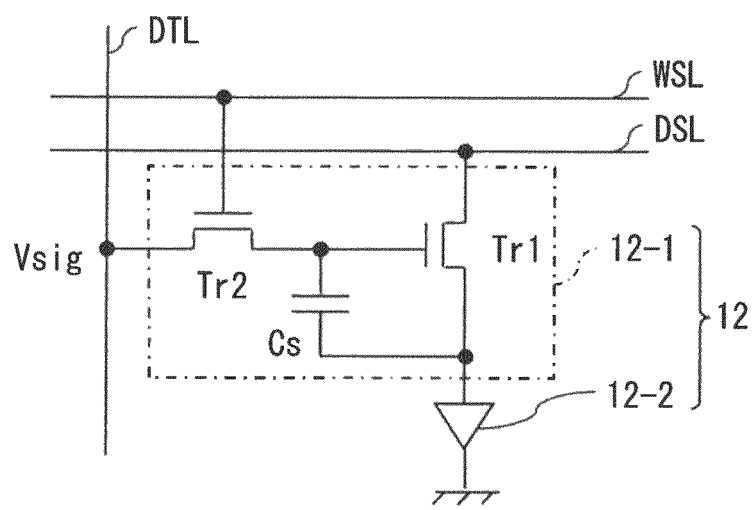
FIG. 2 illustrates a circuit configuration example of a sub-pixel included in each pixel illustrated in FIG. 1.

FIG. 1 schematically illustrates a configuration example of a display unit 1 according to an example embodiment of the disclosure. FIG. 2 illustrates an example of a circuit configuration of a sub-pixel 12 included in each of pixels 11 provided in the display unit 1. The display unit 1 may display an image on an image display surface 1A. The display unit 1 may include, for example, a display panel 10, a photochromic layer 20, an ultraviolet absorption layer 30, a controller 40, and a driver 50. In the present example embodiment, a main surface of the display panel 10 may serve as the image display surface 1A. The photochromic layer 20 and the ultraviolet absorption layer 30 may be provided in this order on side opposite to the image display surface 1A as viewed from the display panel 10. The driver 50 may be mounted on an outer edge of the display panel 10, for example. The display panel 10 may include a plurality of pixels 11 disposed in a matrix. The controller 40 and the driver 50 may drive the display panel 10, i.e., the pixels 11 on the basis of an externally received image signal Din and an externally received synchronizing signal Tin.

[Display Panel 10]

In response to active-matrix driving of the pixels 11 performed by the controller 40 and the driver 50, the display panel 10 may display an image based on the externally received image signal Din and the externally received synchronizing signal Tin. The display panel 10 may include a plurality of scanning lines WSL and a plurality of power lines DSL each extending in a row direction, a plurality of signal lines DTL each extending in a column direction, and the plurality of pixels 11 disposed in a matrix.

The scanning lines WSL may be used to select the pixels 11. The scanning lines WSL may supply a selection pulse to each of the pixels 11 to select the pixels 11 on a predetermined unit basis, for example, a pixel-row basis. The signal lines DTL may be used to supply, to each of the pixels 11, a signal voltage Vsig corresponding to the image signal Din. The signal lines DTL may supply, to each of the pixels 11, a data pulse including the signal voltage Vsig. The power lines DSL may supply electric power to the pixels 11.

The pixels 11 may each include, for example, a sub-pixel 12 (or 12R) that emits red light, a sub-pixel 12 (or 12G) that emits green light, a sub-pixel 12 (or 12B) that emits blue light, and a sub-pixel 12 (or 12U) that emits ultraviolet light. In other words, sub-pixels 12 in a predetermined number are grouped as a color pixel, i.e., the pixel 11. Optionally, the pixels 11 may each further include a sub-pixel 12 that emits light of another color such as white or yellow, for example. The sub-pixels 12 in each of the pixels 11 may be disposed side by side in a predetermined direction such as the row direction, for example. One or more of the sub-pixel 12 (or 12R), the sub-pixel 12 (or 12G), and the sub-pixel 12 (or 12G) correspond to a specific but non-limiting example of a "first sub-pixel" according to one example embodiment of the disclosure. The sub-pixel 12 (or 12U) may correspond to a specific but non-liming example of a "second sub-pixel" according to one example embodiment of the disclosure.

Each of the signal lines DTL may be coupled to an output end of a horizontal selector 51 described later. Each of the signal lines DTL may be assigned to corresponding one of pixel columns, for example. Each of the scanning lines WSL may be coupled to an output end of the write scanner 52 described later. Each of the scanning lines WSL may be assigned to corresponding one of pixel rows, for example. Each of the power lines DSL may be coupled to an output end of a power supply. Each of the power lines DSL may be assigned to corresponding one of the pixel rows, for example.

The sub-pixels 12 may each include a pixel circuit 12-1 and an organic electroluminescent element 12-2. A configuration of the organic electroluminescent element 12-2 is described in detail later.

The pixel circuit 12-1 may control light emission and light extinction in the organic electroluminescent element 12-2. The pixel circuit 12-1 may hold a voltage written into the corresponding sub-pixel 12 by write scanning described later. The pixel circuit 12-1 may include, for example, a driving transistor Tr1, a switching transistor Tr2, and a storage capacitor Cs.

The switching transistor Tr2 may control application of the signal voltage Vsig corresponding to the image signal Din to a gate of the driving transistor Tr1. In a specific but non-limiting example, the switching transistor Tr2 may sample a voltage of the signal line DTL, and may write the thus-sampled voltage into the gate of the driving transistor Tr1. The driving transistor Tr1 may be coupled in series to the organic electroluminescent element 12-2. The driving transistor Tr1 may drive the organic electroluminescent element 12-2. The driving transistor Tr1 may control a current that flows to the organic electroluminescent element 12-2 in response to magnitude of the voltage sampled by the switching transistor Tr2. The storage capacitor Cs may store a predetermined voltage between the gate and a source of the driving transistor Tr1. The storage capacitor Cs may store a gate-source voltage Vgs of the driving transistor Tr1 at a constant level for a predetermined period. It is to be noted that the pixel circuit 12-1 may have a circuit configuration that includes a 2Tr1C circuit described above and additional capacitors and transistors. In an alternative embodiment, the pixel circuit 12-1 may have a circuit configuration different from that of the 2Tr1C circuit described above.

Each of the signal lines DTL may be coupled to an output end of the horizontal selector 51 described later and a source or a drain of the corresponding switching transistor Tr2. Each of the scanning lines WSL may be coupled to an output end of a write scanner 52 described later and a gate of the corresponding switching transistor Tr2. Each of the power lines DSL may be coupled to a power supply circuit and the source or a drain of the corresponding driving transistor Tr1.

The gate of the switching transistor Tr2 may be coupled to the corresponding scanning line WSL. One of the source and the drain of the switching transistor Tr2 may be coupled to the corresponding signal line DTL. A terminal of the source and the drain, which is not coupled to the corresponding signal line DTL, of the switching transistor Tr2 may be coupled to the gate of the driving transistor Tr1. One of the source and the drain of the driving transistor Tr1 may be coupled to the corresponding power line DSL. A terminal of the source and the drain, which is not coupled to the corresponding power line DSL, of the driving transistor Tr1 may be coupled to an anode 21 of the organic electroluminescent element 12-2. One end of the storage capacitor Cs may be coupled to the gate of the driving transistor Tr1. The other end of the storage capacitor Cs may be coupled to a terminal of the source and the drain, which is located on side of the organic electroluminescent element 12-2, of the driving transistor Tr1.

[Photochromic Layer 20]

The photochromic layer 20 may be configured by, for example, a photochromic compound that is colored by ultraviolet light and decolored or color-faded by visible light. Non-limiting examples of the photochromic compound may include azobenzene, fulgide, spiropyran, and a diarylethene derivative. Azobenzene and fulgide are colored in orange by ultraviolet light and colored in light yellow by visible light. Spiropyran and the diarylethene derivative are colored in blue by ultraviolet light, and becomes colorless (decolored) by visible light. The photochromic layer 20 may include a plurality of photochromic elements each of which is provided for the corresponding pixel 11 or the corresponding sub-pixel 12. The photochromic layer 20 may be provided in an entire region opposed to the image display surface 1A of the display panel 10, for example.

[Ultraviolet Absorption Layer 30]

The ultraviolet absorption layer 30 may include, for example, a material that absorbs ultraviolet light. The ultraviolet absorption layer 30 may be provided at a position corresponding to a back surface of the display panel 10 with the photochromic layer 20 being interposed therebetween. Accordingly, the ultraviolet absorption layer 30 may inhibit externally received ultraviolet light from entering the photochromic layer 20 via the ultraviolet absorption layer 30. The ultraviolet absorption layer 30 may include a material that absorbs ultraviolet light and through which visible light is transmitted.

[Driver 50]

The driver 50 may include, for example, the horizontal selector 51 and the write scanner 52. The horizontal selector 51 may apply an analog signal voltage Vsig received from the controller 40 to the signal lines DTL, in response to or in synchronization with input of a control signal, for example. The write scanner 52 may scan the sub-pixels 12 on a predetermined unit basis.

[Controller 40]

Description is given below of the controller 40. The controller 40 may perform a predetermined correction on an externally received digital image signal Din, for example, and generate the signal voltage Vsig on the basis of the image signal obtained through the predetermined correction. The controller 40 may output the generated signal voltage Vsig to the horizontal selector 51, for example. The controller 40 may output a control signal to circuitry in the driver 50 in response to or in synchronization with the externally received synchronizing signal Tin, for example.

Figure 3:
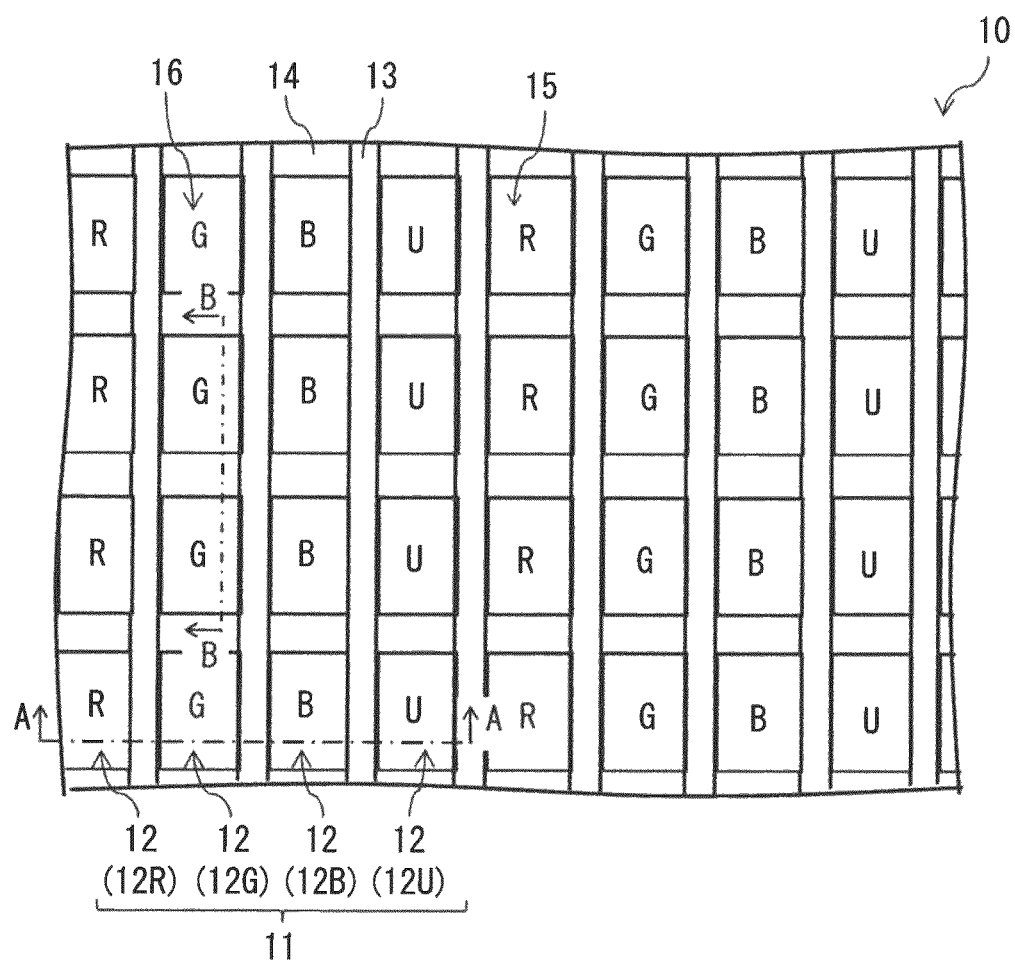
FIG. 3 schematically illustrates a configuration example of a display panel illustrated in FIG. 1.
Figure 4:
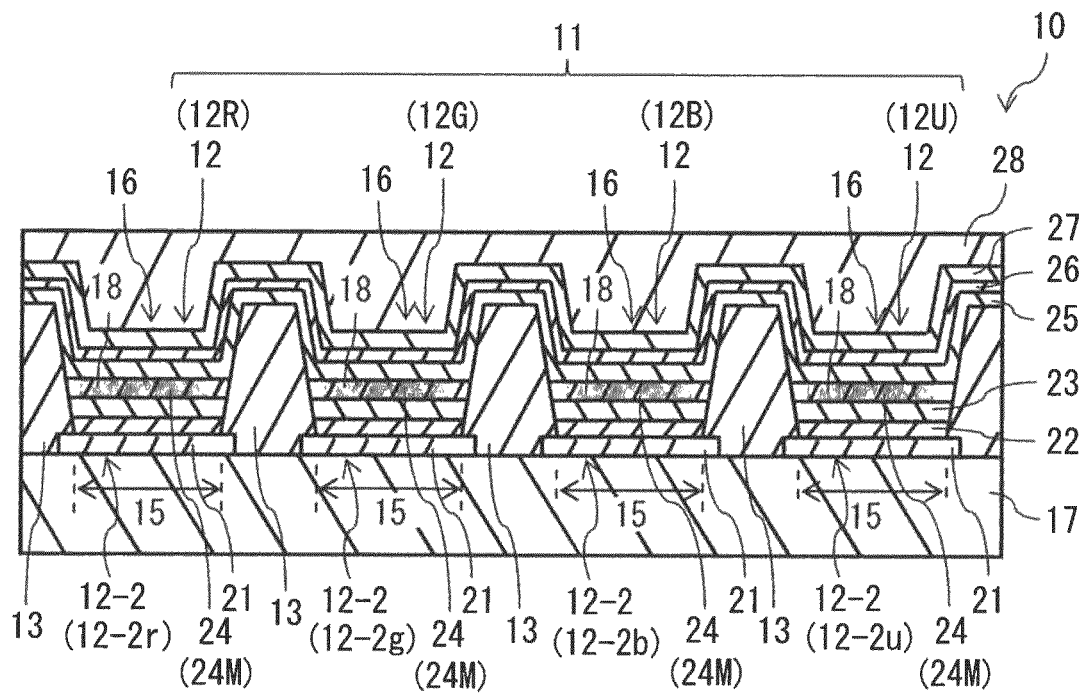
FIG. 4 illustrates a cross-sectional configuration example of the display panel taken along line A-A illustrated in FIG. 3.
Figure 5:
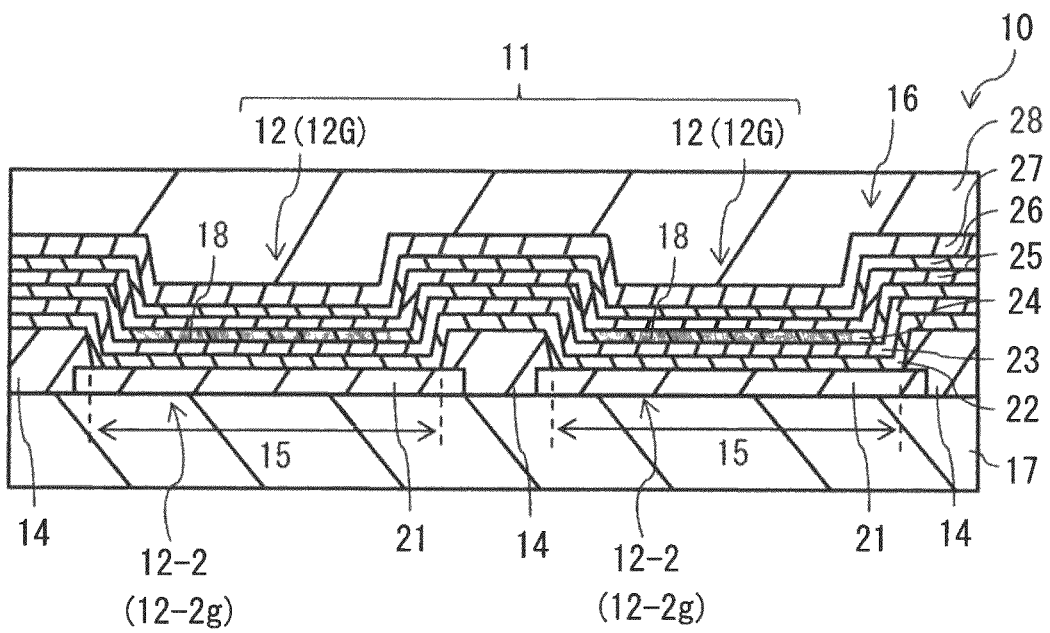
FIG. 5 illustrates a cross-sectional configuration example of the display panel taken along line B-B illustrated in FIG. 3.

Description is given below of the organic electroluminescent element 12-2 with reference to FIGS. 3 to 5. FIG. 3 schematically illustrates a configuration example of the display panel 10. FIG. 4 illustrates a cross-sectional configuration example of the display panel 10 taken along line A-A illustrated in FIG. 3, that is, a cross-sectional configuration example of the pixel 11 disposed in the row direction. FIG. 5 illustrates a cross-sectional configuration example of the display panel 10 taken along line B-B illustrated in FIG. 3, that is, a cross-sectional configuration example of two pixels 11 disposed in the column direction.

In FIG. 3, the sub-pixel 12 (or 12R) that emits red light, the sub-pixel 12 (or 12G) that emits green light, the sub-pixel 12 (or 12B) that emits blue light, and the sub-pixel 12 (or 12U) that emits ultraviolet light may be respectively provided at a location R, a location G, a location B, and a location U. Further, FIG. 3 exemplifies a case where the pixel 11 includes four sub-pixels 12, i.e., the sub-pixels 12R, 12G, 12B, and 12U.

The display panel 10 may include the plurality of pixels 11 disposed in a matrix on the image display surface 1A. The pixels 11 may each include, for example, the sub-pixel 12 (or 12R) that emits red light, the sub-pixel 12 (or 12G) that emits green light, the sub-pixel 12 (or 12B) that emits blue light, and the sub-pixel 12 (or 12U) that emits ultraviolet light, as described above. In the display panel 10, the sub-pixels 12 may each include a material through which visible light is transmitted. Accordingly, the display panel 10 may allow visible light from behind the display panel 10 to be transmitted therethrough via the sub-pixels 12 on the image display surface 1A.

The sub-pixel 12R may include an organic electroluminescent element 12-2 (or 12-2r) that emits red light. The sub-pixel 12G may include an organic electroluminescent element 12-2 (or 12-2g) that emits green light. The sub-pixel 12B may include an organic electroluminescent element 12-2 (or 12-2b) that emits blue light. The sub-pixel 12U may include an organic electroluminescent element 12-2 (or 12-2u) that emits ultraviolet light. The sub-pixels 12R, 12G, 12B, and 12U may be arranged in stripes, for example. In each of the pixels 11, the sub-pixels 12R, 12G, 12B, and 12U may be disposed side by side in the row direction, for example. Further, a plurality of sub-pixels 12 that emits light of the same color may be disposed side by side in the column direction, for example.

The display panel 10 may include a substrate 17. The substrate 17 may include, for example, the organic electroluminescent elements 12-2, a base supporting, for example, line banks 13 described later and banks 14 described later, and a wiring layer provided on the base. The base in the substrate 17 may include a substrate having visible-light transmissivity. The base in the substrate 17 may include, for example, non-alkaline glass, soda-lime glass, non-fluorescent glass, phosphate-based glass, borate-based glass, or quartz. The base in the substrate 17 may include, for example, an acrylic-based resin, a styrene-based resin, a polycarbonate-based resin, an epoxy-based resin, polyethylene, polyester, a silicone-based resin, or alumina. The wiring layer in the substrate 17 may be provided with the pixel circuits 12-1 of the pixels 11, for example.

The display panel 10 may further include, on the substrate 17, for example, a plurality of line banks 13 extending in the column direction and a plurality of banks 14 extending in the row direction. The line banks 13 and the banks 14 may separate the sub-pixels 12 from one another. The line banks 13 may separate the sub-pixels 12 in each of the pixels 11 from one another. The banks 14 may separate the pixels 11 in each pixel column from one another. Each of the banks 14 may be provided between corresponding adjacent two of the line banks 13. Both ends of each of the banks 14 may be coupled to the corresponding adjacent two of the line banks 13. In other words, each of the sub-pixels 12 may be separated by the corresponding adjacent two of the line banks 13 and corresponding adjacent two of the banks 14.

The display panel 10 may further include an opening 15 in a region surrounded by the corresponding adjacent two of the line banks 13 and the corresponding adjacent two of the banks 14. In each of the sub-pixels 12, a surface of the anode 21 described later may be exposed from a bottom surface of the opening 15. This allows for generation of light emission through recombination of holes and electrons in a light-emitting layer 24 described later. The holes may be supplied from the anode 21 exposed from the bottom surface of the opening 15, and the electrons may be supplied from a cathode 27 described later. Thus, a region opposed to the opening 15 of the light-emitting layer 24 may serve as a light emission region 18.

As can be seen from FIGS. 4 and 5, the banks 14 may each have, for example, a height, i.e., a height from the substrate 17 that is lower than a height, i.e., a height from the substrate 17 of each of the line banks 13. The height, i.e., the height from the substrate 17 of each of the banks 14 may be equal to or smaller than a half of a distance from the anode 21 to the cathode 27 in the organic electroluminescent element 12-2, for example.

The line banks 13 and the banks 14 may include, for example, an organic insulating material. Non-limiting examples of the organic insulating material may include an acrylic resin, a polyimide resin, and a novolak phenol resin. In an example embodiment, the line banks 13 and the banks 14 may include, for example, an insulating resin having heat resistance and solvent resistance. The line banks 13 and the banks 14 may be formed, for example, through processing the insulating resin into a desired pattern by photolithography and development. The line banks 13 may each have, for example, a forward tapered cross-sectional shape as illustrated in FIG. 4, an inverse tapered cross-sectional shape that is narrowed toward a base, or a rectangular cross-sectional shape. The banks 14 may each have, for example, a forward tapered cross-sectional shape as illustrated in FIG. 5, an inverse tapered cross-sectional shape that is narrowed toward a base, or a rectangular cross-sectional shape.

The organic electroluminescent elements 12-2 may each include, on the substrate 17, for example, the anode 21, a hole injection layer 22, a hole transport layer 23, the light-emitting layer 24, an electron transport layer 25, an electron injection layer 26, and the cathode 27 in this order. The light-emitting layer 24 corresponds to a specific but non-limiting example of an "organic light-emitting layer" according to one example embodiment of the disclosure.

The organic electroluminescent elements 12-2 may each include, for example, the light-emitting layer 24, and the anode 21 and the cathode 27 disposed to interpose the light-emitting layer 24 therebetween. The organic electroluminescent elements 12-2 may each further include, between the anode 21 and the light-emitting layer 24, for example, the hole injection layer 22 and the hole transport layer 23 in this order from the anode 21. It is to be noted that one or both of the hole injection layer 22 and the hole transport layer 23 may be omitted. The organic electroluminescent elements 12-2 may each further include, between the light-emitting layer 24 and the cathode 27, for example, the electron transport layer 25 and the electron injection layer 26 in this order from the light-emitting layer 24. It is to be noted that one or both of the electron transport layer 25 and the electron injection layer 26 may be omitted. The organic electroluminescent elements 12-2 may each have an element structure that includes, for example, the anode 21, the hole injection layer 22, the hole transport layer 23, the light-emitting layer 24, the electron transport layer 25, the electron injection layer 26, and the cathode 27 in this order from the substrate 17. Optionally, the organic electroluminescent elements 12-2 may each further include any other functional layers.

The hole injection layer 22 may be provided to enhance hole injection efficiency. The hole transport layer 23 may be provided to transport holes injected from the anode 21 to the light-emitting layer 24. The light-emitting layer 24 may be provided to emit light of a predetermined color by recombination of electrons and holes. The electron transport layer 25 may be provided to transport electrons injected from the cathode 27 to the light-emitting layer 24. The electron injection layer 26 may be provided to enhance electron injection efficiency. One or both of the hole injection layer 22 and the electron injection layer 26 may be omitted. Optionally, the organic electroluminescent elements 12-2 may each further include any layer other than the layers described above.

The anode 21 may be provided on the substrate 17, for example. The anode 21 may be a transparent electrode having translucency with respect to visible light, for example. Non-limiting examples of a material of the transparent electrode used for the anode 21 may include a transparent electrically-conductive material such as indium tin oxide (no) or indium zinc oxide (IZO). An end edge of the anode 21 may be embedded in the line bank 13 and the bank 14, for example. In a case where the end edge of the anode 21 is embedded in the line bank 13 and the bank 14, it is possible to adjust a size or area of each sub-pixel 12 and a size or area of the light emission region 18, through changing a size of each opening 15, or in a specific but non-limiting example, through changing a size of a bottom surface of each opening 15.

The cathode 27 may be, for example, a transparent electrode having translucency with respect to visible light. Non-limiting examples of a material of the transparent electrode used for the cathode 27 may include a transparent electrically-conductive material such as ITO or IZO. In the present example embodiment, in a case where the anode 21 and the cathode 27 have translucency and the organic electroluminescent element 12-2 itself has translucency, light generated by the organic electroluminescent element 12-2 is emitted not only to side of the image display surface 1A but also to side of the photochromic layer 20. Further, in the present example embodiment, in a case where the substrate 17 and a sealing layer 28 described later have translucency with respect to visible light, a viewer is allowed to visually recognize a background behind the display panel 10. In other words, the display panel 10 may be a panel having translucency with respect to visible light, i.e., a so-called transparent display panel.

The hole injection layer 22 may facilitate injection of holes from the anode 21 into the light-emitting layer 24. The hole injection layer 22 may include, for example, any of oxides of silver (Ag), molybdenum (Mo), chromium (Cr), vanadium (V), tungsten (W), nickel (Ni), and iridium (Ir), and an electrically-conductive polymeric materials such as a mixture of polythiophene and polystyrene sulfonate (PEDOT). The hole injection layer 22 may be configured by a single layer, or may be configured by a plurality of layers that are stacked.

The hole transport layer 23 may transport holes injected from the anode 21 to the light-emitting layer 24. The hole transport layer 23 may include, for example, a material (hereinafter referred to as "hole transporting material 23M") that transports holes injected from the anode 21 to the light-emitting layer 24. The hole transport layer 23 may include the hole transporting material 23M as a main component.

Non-limiting examples of the hole transporting material 23M as a raw material or a material of the hole transport layer 23 may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof. In an example embodiment, a difference in highest occupied molecular orbital (HOMO) level between the respective materials of the hole injection layer 22 and the hole transport layer 23 may be equal to or lower than 0.5 eV in consideration of a hole injection property.

The light-emitting layer 24 may emit light through generation of excitons caused by recombination, in the light-emitting layer 24, of holes injected from the anode 21 and electrons injected from the cathode 27. The light-emitting layer 24 may be a coated film, for example. The light-emitting layer 24 may be formed through coating with a solution and drying the solution. The solution may contain, as a main component of a solute, an organic material (hereinafter referred to as "organic light-emitting material 24M") that emits light through generation of excitons caused by recombination of holes and electrons. The light-emitting layer 24 may include the organic light-emitting material 24M as a main component. In the organic electroluminescent element 12-2r included in the sub-pixel 12R, the organic light-emitting material 24M may contain an organic material that emits red light by current application. In other words, the sub-pixel 12R may include the light-emitting layer 24 corresponding to the organic light-emitting layer that emits red light by current application. In the organic electroluminescent element 12-2g included in the sub-pixel 12G, the organic light-emitting material 24M may contain an organic material that emits green light by current application. In other words, the sub-pixel 12G may include the light-emitting layer 24 corresponding to the organic light-emitting layer that emits green light by current application. In the organic electroluminescent element 12-2b included in the sub-pixel 12B, the organic light-emitting material 24M may contain an organic material that emits blue light by current application. In other words, the sub-pixel 12B may include the light-emitting layer 24 corresponding to the organic light-emitting layer that emits blue light by current application. In the organic electroluminescent element 12-2u included in the sub-pixel 12U, the organic light-emitting material 24M may contain an organic material that emits ultraviolet light by current application. In other words, the sub-pixel 12U may include the light-emitting layer 24 that emits ultraviolet light by current application. The light-emitting layer 24 corresponds to a specific but non-limiting example of an "ultraviolet light-emitting layer" according to one example embodiment of the disclosure.

The light-emitting layer 24 may be configured by, for example, a single organic light-emitting layer or a plurality of organic light-emitting layer that are stacked. In a case where the light-emitting layer 24 is configured by a plurality of organic light-emitting layers that are stacked, the light-emitting layer 24 may include a stack of a plurality of organic light-emitting layers including a common main component. The organic light-emitting layers may be formed through coating with a solution containing the organic light-emitting material 24M as the main component of the solute and drying the solution.

The organic light-emitting material 24M as the raw material or the material of the light-emitting layer 24 may be, for example, a dopant material only. In an example embodiment, the organic light-emitting material 24M may be a combination of a host material and a dopant material. In other words, the light-emitting layer 24 may contain, as the organic light-emitting material 24M, the host material and the dopant material. The host material may mainly serve to transport charges such as electrons and holes, and the dopant material may serve to emit light. The organic light-emitting material is not limited to a combination of only one host material and only one dopant material, and may be a combination of two or more host materials and two or more dopant materials. An amount of the dopant material may be in a range from 0.01 wt % to 30 wt % both inclusive with respect to the host material. In an example embodiment, the amount of the dopant material may be in a range from 0.01 wt % to 10 wt % both inclusive.

Non-limiting examples of the host material of the light-emitting layer 24 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the dopant material of the light-emitting layer 24 may include a pyrene derivative, a fluoranthene derivative, an arylacetylene derivative, a fluorene derivative, a perylene derivative, an oxadiazole derivative, an anthracene derivative, and a chrysene derivative. Further, a metal complex may be used as the dopant material of the light-emitting layer 24. The metal complex may contain a ligand and an atom of metal such as iridium (Ir), platinum (Pt), osmium (Os), gold (Au), rhenium (Re), or ruthenium (Ru).

The electron transport layer 25 may transport, to the light-emitting layer 24, electrons injected from the cathode 27. The electron transport layer 25 may include, for example, an organic material having an electron transport property (hereinafter referred to as "electron transporting material 25M") as a main component. The electron transport layer 25 may be configured by a deposited film or a sputtering film, for example. In an example embodiment, the electron transport layer 25 may have, for example, a charge-blocking property to suppress tunneling of charges such as holes in the present example embodiment from the light-emitting layer 24 to the cathode 27 and a property to suppress light extinction of the light-emitting layer 24 in an excitation state.

The electron transporting material 25M that is a raw material or a material of the electron transport layer 25 may be an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Alternatively, the electron transport layer 25 may include a metal having an electron transporting property. The electron transport layer 25 including the metal having the electron transporting property makes it possible to exhibit an enhanced electron transporting property. Non-limiting examples of the metal included in the electron transport layer 25 may include barium (Ba), lithium (Li), calcium (Ca), potassium (K), cesium (Cs), sodium (Na), rubidium (Rb), and ytterbium (Yb).

The electron injection layer 26 may inject, into the electron transport layer 25 and the light-emitting layer 24, electrons injected from the cathode 27. The electron injection layer 26 may include, for example, a material, i.e., an electron injecting material that facilitates injection of electrons from the cathode 27 into the electron transport layer 25 and the light-emitting layer 24. The electron injecting material described above may be, for example, an organic material having an electron injection property and doped with a metal having an electron injection property. The metal doped in the electron injection layer 26 may be identical to the metal doped in the electron transport layer 25, for example. The electron transport layer 25 may be configured by a deposited film or a sputtering film, for example.

In the present example embodiment, respective layers of the organic electroluminescent element 12-2, such as the hole injection layer 22, the hole transport layer 23, the light-emitting layer 24, the electron transport layer 25, and the electron injection layer 26 may be shared by the sub-pixels 12 provided in a strip-like region, that is, a groove 16 surrounded by corresponding adjacent two of the line banks 13.

In the present example embodiment, some of the layers in the organic electroluminescent element 12-2 such as the hole injection layer 22, the hole transport layer 23, and the light-emitting layer 24 may not be shared by the sub-pixels 12 in one pixel 11, and may be separately provided in each of the sub-pixels 12 in one pixel 11. In other words, for example, some of the layers in the organic electroluminescent element 12-2 such as the hole injection layer 22, the hole transport layer 23, and the light-emitting layer 24 may be provided to avoid the line banks 13, as illustrated in FIG. 4. Further, in the present example embodiment, some of the layers in the organic electroluminescent element 12-2 such as the electron transport layer 25 and the electron injection layer 26 may be shared by the sub-pixels 12 in one pixel 11. In other words, for example, some of the layers in the organic electroluminescent element 12-2 such as the electron transport layer 25 and the electron injection layer 26 may be provided over the line banks 13, as illustrated in FIG. 4. In the present example embodiment, the cathode 27 may be provided in the entire display region of the display panel 10.

The organic electroluminescent element 12-2 may further include, for example, a layer, i.e., the sealing layer 28 that protects and seals the organic electroluminescent element 12-2, as illustrated in FIGS. 4 and 5. The sealing layer 28 may include a resin material such as an epoxy resin, a vinyl-based resin, an acrylic-based resin, or a silicone-based resin.

[Effects]

Description is given below of effects of the display panel 10 according to the present example embodiment and the display unit 1 provided with the display panel 10.

Figure 6:
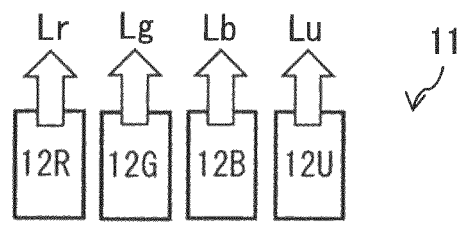
FIG. 6 illustrates a light emission state of each pixel illustrated in FIG. 1.

In the present example embodiment, the display panel 10, the photochromic layer 20, and the ultraviolet absorption layer 30 are provided. At this occasion, during image display, for example, the sub-pixel 12R, the sub-pixel 12G, the sub-pixel 12B, and the sub-pixel 12U respectively emit the red light Lr, the green light Lg, the blue light Lb, and the ultraviolet light Lu, as illustrated in FIG. 6. Thus, the ultraviolet light emitted from the sub-pixel 12U is applied to the photochromic layer 20 to color the photochromic layer 20 in a predetermined color. In a case where the photochromic compound is azobenzene or fulgide, the photochromic layer 20 is colored in orange by the ultraviolet light. In a case where the photochromic compound is spiropyran or a diarylethene derivative, the photochromic layer 20 is colored in blue by the ultraviolet light. As a result, for example, a background generated by the photochromic layer 20 is superimposed behind an image generated by each of the pixels 11, thereby improving contrast on the image display surface 1A. This makes it possible to reduce deterioration in visibility caused by reduction in contrast or any other factor.

Further, in the present example embodiment, the photochromic layer 20 and the ultraviolet absorption layer 30 are provided in this order on side opposite to the image display surface 1A as viewed from the light-emitting layer 24 or the display panel 10. Accordingly, when the photochromic layer 20 is colored in a predetermined color by ultraviolet light, an image generated by each of the pixels 11 is not blocked by the photochromic layer 20, and the background generated by the photochromic layer 20 leads to an improvement in contrast of the image generated by each of the pixels 11. This makes it possible to reduce deterioration in visibility caused by reduction in contrast or any other factor.

In the present example embodiment, the pixels 11 each include the sub-pixels 12R, 12G, and 12B, as the first sub-pixels, respectively including the red light-emitting layer, the green light-emitting layer, and the blue light-emitting layer, and the sub-pixel 12U, as the second sub-pixel, including the ultraviolet light-emitting layer. Accordingly, for example, only adding a sub-pixel for ultraviolet light to each pixel of an organic electroluminescent display panel that performs typical RGB light emission makes it possible to form the display panel 10 according to the present example embodiment.

In the present example embodiment, the display panel 10 has, in the image display surface 1A, a light-transmissive region through which visible light from behind the display panel 10 is transmitted. For example, in a case where the organic electroluminescent elements 12-2, the base included in the substrate 17, and the sealing layer 28 have translucency with respect to visible light, at least a location, opposed to the opening 15, of the image display surface 1A serves as the light-transmissive region, for example. Thus, visible light entering the rear of the display panel 10 is transmitted to a front surface of the display panel 10 via the light-transmissive region. This makes it possible for a viewer to visually recognize a background behind the display panel 10 via the display panel 10.

2. Modification Examples

Description is given below of modification examples of the display panel 10 according to the foregoing example embodiment.

Modification Example A

Figure 7:
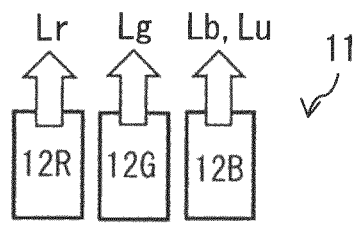
FIG. 7 illustrates a light emission state of each pixel according to a modification example.

FIG. 7 illustrates a modification example of each of the pixels 11 in the display panel 10 according to the foregoing example embodiments. In the present modification example, the sub-pixel 12U are not provided in each of the pixels 11 according to the foregoing example embodiments, and the sub-pixel 12B in each of the pixels 11 according to the foregoing example embodiments may be configured to emit light including blue light and ultraviolet light. In other words, in the present modification example, the organic electroluminescent element 12-2 included in the sub-pixel 12B may include an organic layer, i.e., the light-emitting layer 24 that emits light including visible light and ultraviolet light by current application.

Accordingly, during image display, for example, the sub-pixel 12R and the sub-pixel 12G may respectively emit the red light Lr and the green light Lg, and the sub-pixel 12B may emit the blue light Lb and the ultraviolet light Lu, as illustrated in FIG. 7. This causes the ultraviolet light emitted from the sub-pixel 12B to be applied to the photochromic layer 20, thereby coloring the photochromatic layer 20 in a predetermined color. In a case where the photochromic compound is azobenzene or fulgide, the photochromic layer 20 may be colored in orange by the ultraviolet light. In a case where the photochromic compound is spiropyran or a diarylethene derivative, the photochromic layer 20 may be colored in blue by the ultraviolet light. As a result, for example, a background generated by the photochromic layer 20 is superimposed behind an image generated by each of the pixels 11, thereby improving contrast on the image display surface 1A. This makes it possible to reduce deterioration in visibility caused by reduction in contrast or any other factor.

Further, in the present modification example, the pixels 11 may each include the sub-pixels 12R, 12G, and 12B respectively including the red light-emitting layer, the green light-emitting layer, and a blue-ultraviolet light-emitting layer. In other words, the organic electroluminescent element 12-2 included in the sub-pixel 12B may include an organic layer, i.e., the light-emitting layer 24 that emits light including visible light and ultraviolet light by current application. Accordingly, for example, only replacing a blue sub-pixel of each pixel of an organic electroluminescent display panel performing typical RGB light emission with a sub-pixel for blue-ultraviolet light makes it possible to form the display panel 10 according to the present modification example. [Modification Example B]

Figure 8:
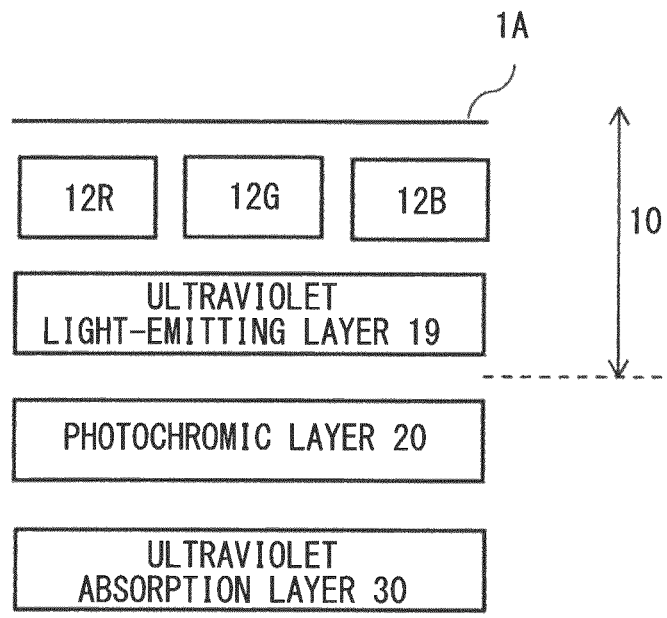
FIG. 8 schematically illustrates a modification example of a configuration of the display unit illustrated in FIG. 1.
Figure 9:
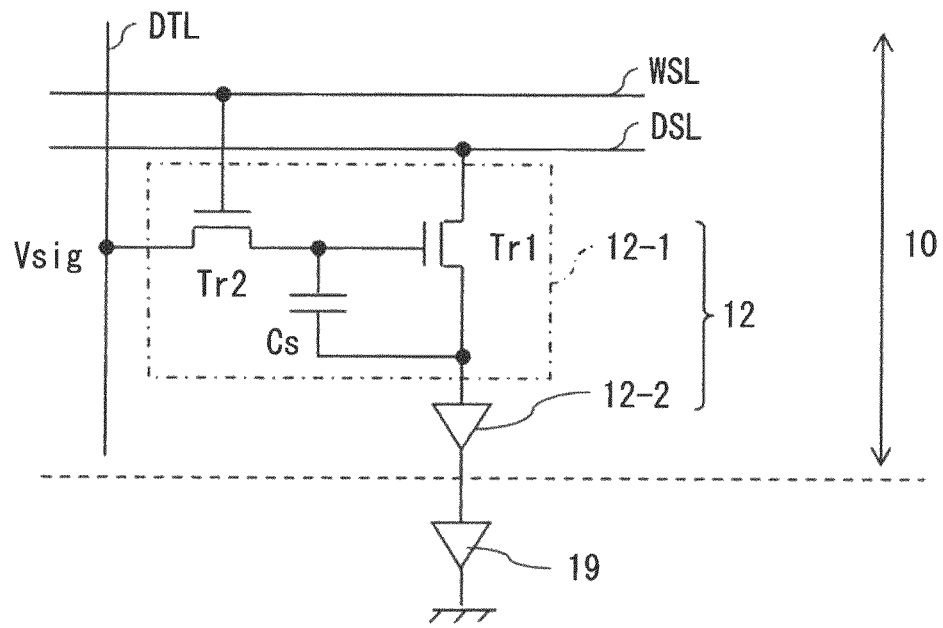
FIG. 9 illustrates a circuit configuration example of a sub-pixel included in each pixel illustrated in FIG. 1.

FIG. 8 schematically illustrates a modification example of the configuration of the display unit 1 according to the foregoing example embodiments. The display unit 1 according to the present modification example may include the display panel 10 provided with an ultraviolet light-emitting layer 19 that emits ultraviolet light by current application in place of the sub-pixel 12U. The ultraviolet light-emitting layer 19 may be provided on side opposite to the image display surface 1A as viewed from the light-emitting layers 24 or the sub-pixels 12R, 12G, and 12B, for example, as illustrated in FIG. 8. In other words, in the present modification example, the ultraviolet light-emitting layer 19 may be provided directly below the light-emitting layers 24 or the sub-pixels 12R, 12G, and 12B, for example. The ultraviolet light-emitting layer 19 may be electrically coupled in series to one or more of the red light-emitting layer 24 or the organic electroluminescent element 12-2 including the red light-emitting layer 24, the green light-emitting layer 24 or the organic electroluminescent element 12-2 including the green light-emitting layer 24, and the blue light-emitting layer 24 or the organic electroluminescent element 12-2 including the blue light-emitting layer 24, for example, as illustrated in FIG. 9. In the present modification example, the ultraviolet light-emitting layer 19 may be provided in a current path of the organic electroluminescent element 12-2 in such a manner, which eliminates the need for providing a circuit supplying a current to the ultraviolet light-emitting layer 19 separately from the pixel circuit 12-1. As a result, it is possible to form the display panel 10 according to the present modification example including a smaller number of components.

Modification Example C

Figure 10:
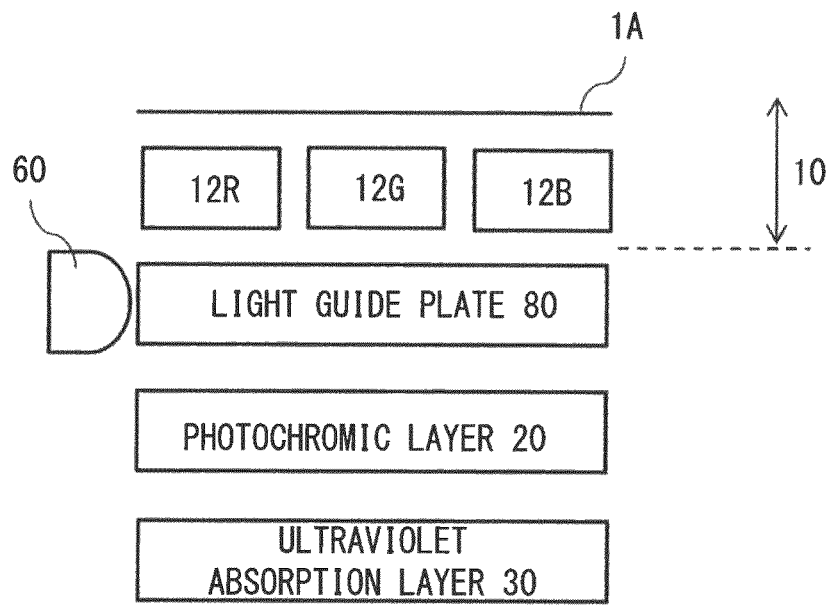
FIG. 10 schematically illustrates a modification example of the configuration of the display unit illustrated in FIG. 1.

FIG. 10 schematically illustrates a modification example of the configuration of the display unit 1 according to the foregoing example embodiments. In the display unit 1 according to the present modification example, the sub-pixel 12U are not provided. The display unit 1 according to the present modification example may include a light guide plate 80 between the display panel 10 and the photochromic layer 20, and may further include an edge light 60, i.e., an ultraviolet light source that applies ultraviolet light to an edge of the light guide plate 80. The light guide plate 80 may apply light incident from the edge of the light guide plate 80 toward the display panel 10.

The edge light 60 may be provided along one or more edges of the light guide plate 80. The edge light 60 may simultaneously apply light to a portion, opposed to the edge light 60, of the edge of the light guide plate 80. At this occasion, the light guide plate 80 may output, from an entire bottom surface thereof, light incident from the edge of the light guide plate 80. The bottom surface may be a surface, on side of the photochromic layer 20, of the light guide plate 80. In other words, the light guide plate 80 may serve as a surface-emitting light source, i.e., a surface-emitting ultraviolet light source.

Figure 11:
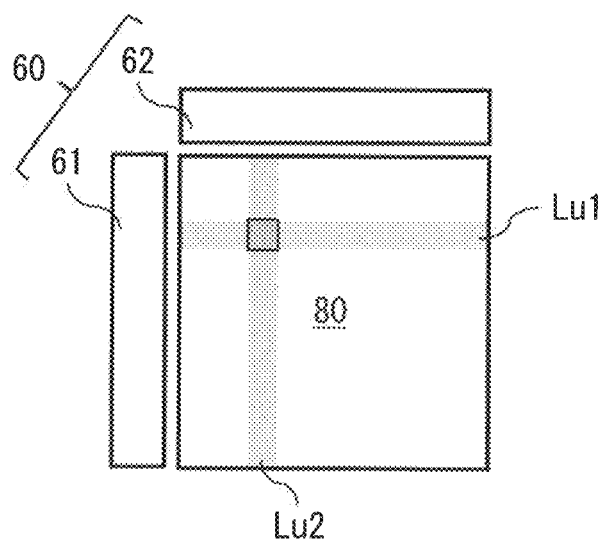
FIG. 11 illustrates an emission state of ultraviolet light in the display unit illustrated in FIG. 10.

The edge light 60 may include an edge light 61 and an edge light 62, for example, as illustrated in FIG. 11. The edge light 61 may be provided at a position opposed to one edge of the light guide plate 80, and the edge light 62 may be provided at a position opposed to an edge, orthogonal to the edge opposed to the edge light 61, of the light guide plate 80. At this occasion, the edge lights 61 and 62 may partially apply ultraviolet light to the edges of the light guide plate 80 independently of each other. Ultraviolet light Lu1 emitted from the edge light 61 and ultraviolet light Lu2 emitted from the edge light 62 may intersect with each other in the light guide plate 80. As a result, the light guide plate 80 may output, from the bottom surface thereof, ultraviolet light having locally high intensity at a position opposed to a point where the ultraviolet light Lu1 and the ultraviolet light Lu2 intersect with each other. In other words, at this occasion, the light guide plate 80 may serve as a surface-emitting light source, i.e., a surface-emitting ultraviolet light source that emits, from side of the bottom surface, ultraviolet light of which an intensity distribution is controlled by the edge lights 61 and 62.

Accordingly, during image display, applying ultraviolet light from the bottom surface of the light guide plate 80 toward the photochromic layer 20 causes coloring of the photochromic layer 20 in a predetermined color. In a case where the photochromic compound is azobenzene or fulgide, the photochromic layer 20 may be colored in orange by the ultraviolet light. In a case where the photochromic compound is spiropyran or a diarylethene derivative, the photochromic layer 20 may be colored in blue by the ultraviolet light. As a result, for example, a background generated by the photochromic layer 20 is superimposed behind an image generated by each of the pixels 11, thereby improving contrast on the image display surface 1A. This makes it possible to reduce deterioration in visibility caused by reduction in contrast or any other factor.

Modification Example D

Figure 12:
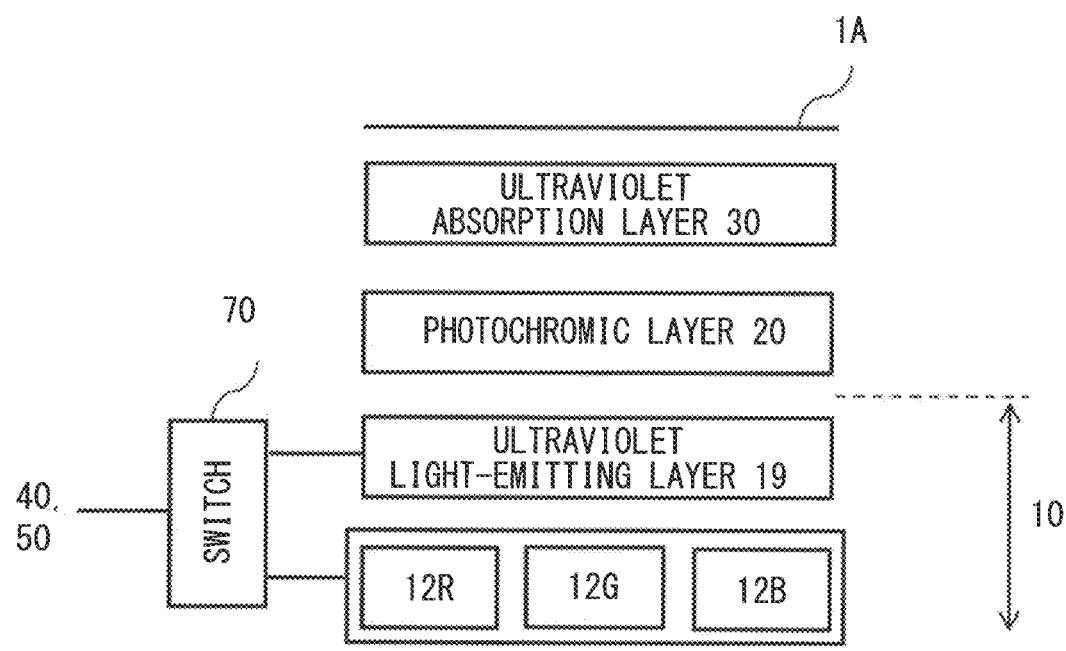
FIG. 12 schematically illustrates a modification example of the configuration of the display unit illustrated in FIG. 1.

FIG. 12 schematically illustrates a modification example of the configuration of the display unit 1 according to the foregoing modification example B. In the display unit 1 according to the present modification example, the photochromic layer 20 and the ultraviolet absorption layer 30 may be provided in this order on side of the image display surface 1A as viewed from the light-emitting layers 24 or the sub-pixels 12R, 12G, and 12B. In the present modification example, a top surface of the ultraviolet absorption layer 30 may serve as the image display surface 1A. In the present modification example, the display panel 10 may include the ultraviolet light-emitting layer 19 that emits ultraviolet light by current application on side of the image display surface 1A as viewed from the light-emitting layers 24 or the sub-pixels 12R, 12G, and 12B. The display unit 1 according to the present modification example may further include a switch 70. The ultraviolet light-emitting layer 19 may be electrically coupled in parallel to the red light-emitting layer 24 or the sub-pixel 12R, the green light-emitting layer 24 or the sub-pixel 12G, and the blue light-emitting layer 24 or the sub-pixel 12B via the switch 70, for example, as illustrated in FIG. 12.

Accordingly, controlling the switch 70 allows the controller 40 and the driver 50 to perform switching between current application to the light-emitting layer 24 and current application to the ultraviolet light-emitting layer 19. As a result, during current application to the light-emitting layer 24, an image may be displayed. In contrast, during current application to the ultraviolet light-emitting layer 19, ultraviolet light emitted from the ultraviolet light-emitting layer 19 may enter the photochromic layer 20 and color the photochromic layer 20 in a predetermined color. At this occasion, in a case where the photochromic layer 20 is colored in a color blending with a surrounding environment, it is possible to make the screen less noticeable unnaturally in the surrounding environment.

Modification Example E

In the foregoing example embodiments and modification examples, a location, opposed to each of the organic electroluminescent elements 12-2, of the image display surface 1A may serve as the light-transmissive region. Optionally, in the foregoing example embodiments and modification examples, the pixels 11 may each include, for example, a sub-pixel, i.e., a non-display pixel having a light-transmissive region through which visible light from behind the display panel 10 is transmitted, separately from the sub-pixels 12 used for image display. Further, in the foregoing example embodiments and modification examples, the display panel 10 may include, for example, a non-display pixel having a light-transmissive region through which visible light from behind the display panel 10 is transmitted, separately from the pixels 11 used for image display. In these cases, in each of the organic electroluminescent elements 12-2, the anode 21 may be a reflective electrode including, for example, aluminum (Al), silver (Ag), an aluminum alloy, or a silver alloy, or may be a reflective electrode having light reflectivity. Even in such a configuration, the photochromic layer 20 makes it possible to reduce deterioration in visibility caused by reduction in contrast or any other factor and to make the screen less noticeable unnaturally in the surrounding environment.

3. Application Examples

Application Example 1

Description is given below of application examples of the display unit 1 according to any of the foregoing example embodiments and modification examples. The display unit 1 according to any of the foregoing example embodiments and modification examples is applicable to a variety of display units of electronic apparatuses that display images or pictures based on externally received or internally received image signals. Non-limiting examples of the electronic apparatuses may include televisions, digital cameras, notebook personal computers, sheet-like personal computers, portable terminal devices such as mobile phones, and video cameras.

Figure 13:
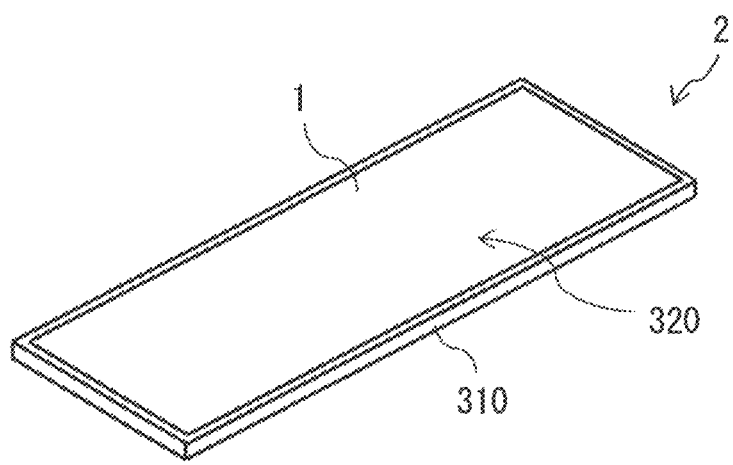
FIG. 13 is a perspective view of an example of an appearance of an electronic apparatus provided with a display unit according to one example embodiment of the disclosure.

FIG. 13 is a perspective view of an appearance of an electronic apparatus 2 according to the present application example. The electronic apparatus 2 may be, for example, a sheet-like personal computer including a body 310 having a display surface 320 on a main surface. The electronic apparatus 2 may include the display unit 1 according to any of the foregoing example embodiments and modification examples on the display surface 320 of the electronic apparatus 2. In the display unit 1 according to any of the foregoing example embodiments and modification examples, the display panel 10 may be disposed to face a front surface of the electronic apparatus 2. In the present application example, the display unit 1 according to any of the foregoing example embodiments and modification examples may be provided on the display surface 320, which makes it possible to achieve the electronic apparatus 2 having high contrast.

Although description has been given hereinabove with reference to the example embodiments and the modification examples, the disclosure is not limited thereto, but may be modified in a wide variety of ways. The effects described hereinabove are mere examples. Effects of one example embodiment of the disclosure are not limited to those described hereinabove. The disclosure may further include any effects other than those described hereinabove.

It is to be noted that the disclosure may also have the following configurations.

(1)

A display unit including:

a display panel including an image display surface with a plurality of pixels, the pixels being provided below the image display surface and each including an organic light-emitting layer;

a photochromic layer configured to be colored by ultraviolet light and be decolored or color-faded by visible light; and an ultraviolet absorption layer.

(2)

The display unit according to (1), in which the photochromic layer and the ultraviolet absorption layer are provided in this order on side opposite to the image display surface as viewed from the organic light-emitting layer.

(3)

The display unit according to (1) or (2), in which the organic light-emitting layer includes an organic layer configured to emit light including visible light and ultraviolet light by current application.

(4)

The display unit according to (1) or (2), in which the display panel further includes an ultraviolet light-emitting layer configured to emit ultraviolet light by current application.

(5)

The display unit according to (4), in which the ultraviolet light-emitting layer is electrically coupled in series to the organic light-emitting layer.

(6)

The display unit according to (4), in which the pixels each include a first sub-pixel including the organic light-emitting layer and a second sub-pixel including the ultraviolet light-emitting layer.

(7)

The display unit according to (5), in which the ultraviolet light-emitting layer is provided on side opposite to the image display surface as viewed from the organic light-emitting layer.

(8)

The display unit according to (1) or (2), further including:

a light guide plate provided between the display panel and the photochromic layer; and an ultraviolet light source configured to apply ultraviolet light to an edge of the light guide plate.

(9)

The display unit according to (1), in which the photochromic layer and the ultraviolet absorption layer are provided in this order on side of the image display surface as viewed from the organic light-emitting layer.

(10)

The display unit according to (9), in which the display panel further includes an ultraviolet light-emitting layer on the side of the image display surface as viewed from the organic light-emitting layer, the ultraviolet light-emitting layer being configured to emit ultraviolet light by current application.

(11)

The display unit according to (10), further including a driver unit configured to drive the display panel, in which the ultraviolet light-emitting layer is electrically coupled in parallel to the organic light-emitting layer via a switch, and the driver unit controls the switch to perform switching between current application to the organic light-emitting layer and current application to the ultraviolet light-emitting layer.

(12)

The display unit according to any one of (1) to (11), in which the display panel has, in the image display surface, a light-transmissive region through which visible light from behind the display panel is transmitted.

In the display unit according to one embodiment of the disclosure, the display panel, the photochromic layer, and the ultraviolet absorption layer are provided. Accordingly, for example, during image display, contrast is improved by application of ultraviolet light to the photochromic layer. Further, for example, during non-display of an image, application of ultraviolet light to the photochromic layer causes change in color of the photochromic layer to a color blending with a surrounding environment.

According to the display unit of one embodiment of the disclosure, the display panel, the photochromic layer, and the ultraviolet absorption layer are provided. This makes it possible to reduce deterioration in visibility caused by reduction in contrast or any other factor and to make the screen less noticeable unnaturally in the surrounding environment. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A display unit comprising:
a display panel including an image display surface with a plurality of pixels, the pixels being provided below the image display surface and each including an organic light-emitting layer;
a photochromic layer immediately adjacent to the display panel, and configured to be colored by ultraviolet light and be decolored or color-faded by visible light; and
an ultraviolet absorption layer,
a driver unit controls the switch to perform switching between current application to the organic light-emitting layer and current application to the ultraviolet light-emitting layer,
wherein the display panel further includes an ultraviolet light-emitting layer on the side of the image display surface as viewed from the organic light-emitting layer, the ultraviolet light-emitting layer being configured to emit ultraviolet light by current application,
wherein the photochromic layer and the ultraviolet absorption layer are provided in this order on side of the image display surface as viewed from the organic light-emitting layer, and
wherein the ultraviolet light-emitting layer is electrically coupled in parallel to the organic light-emitting layer via a switch.

2. A display unit comprising:
a display panel including an image display surface with a plurality of pixels, the pixels being provided below the image display surface and each including an organic light-emitting layer;
a photochromic layer configured to be colored by ultraviolet light and be decolored or color-faded by visible light; and
an ultraviolet absorption layer,
wherein the display panel further includes an ultraviolet light-emitting layer configured to emit ultraviolet light by current application,
wherein the ultraviolet light-emitting layer is electrically coupled in series to the organic light-emitting layer.

3. The display unit according to claim 2, wherein the pixels each include a first sub pixel including the organic light-emitting layer and a second sub-pixel including the ultraviolet light-emitting layer.

4. The display unit according to claim 2, wherein the ultraviolet light-emitting layer is provided on side opposite to the image display surface as viewed from the organic light-emitting layer.

* * * * *